(12) United States Patent
Weibezahn

(10) Patent No.: US 8,701,280 B2
(45) Date of Patent: Apr. 22, 2014

(54) METHOD FOR FORMING A FLEXIBLE ELECTRICAL SUBSTRATE

(75) Inventor: Karl S Weibezahn, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 116 days.

(21) Appl. No.: 13/367,915

(22) Filed: Feb. 7, 2012

(65) Prior Publication Data

US 2012/0132614 A1  May 31, 2012

Related U.S. Application Data

(62) Division of application No. 12/464,597, filed on May 12, 2009, now Pat. No. 8,138,412.

(51) Int. Cl.
*B32B 15/08* (2006.01)
*C23C 18/16* (2006.01)
*H01L 31/042* (2006.01)
*H01L 31/05* (2006.01)
*H05K 1/02* (2006.01)

(52) U.S. Cl.
USPC .............. 29/831; 29/832; 29/847; 156/47

(58) Field of Classification Search
CPC ..... H05K 1/0206; H05K 3/361; H05K 3/205; H05K 3/4015; H05K 1/0289; H05K 3/4685; H05K 3/4658; H05K 3/4647; H05K 3/4652; H05K 3/4655; B32B 15/08; C23C 18/1608; C23C 18/1653; C23C 18/30; C25D 5/022; H01L 31/042; H01L 31/05
USPC ...................... 29/831, 832, 846, 847; 156/47
See application file for complete search history.

(56) References Cited

U.S. PATENT DOCUMENTS

| | | | |
|---|---|---|---|
| 4,779,340 A * | 10/1988 | Kihm et al. ............... | 29/847 |
| 2003/0047208 A1 * | 3/2003 | Glenn et al. ............... | 136/246 |
| 2004/0256352 A1 * | 12/2004 | Perlov et al. .............. | 216/13 |

* cited by examiner

*Primary Examiner* — Livius R Cazan

(57) ABSTRACT

A flexible substrate layer having metallic bus-lines and connecting stitches is formed. A trace layer having electrical traces and thermal vias is also formed. The substrate layer and the trace layer are bonded together by way of respective thermal pathways and electrically interconnected. The resulting layer-wise assembly is configured to support and electrically interconnect an array of photovoltaic cells and to channel away heat during operation.

9 Claims, 8 Drawing Sheets

METHOD FOR FORMING A FLEXIBLE ELECTRICAL SUBSTRATE

This application is a Divisional of, and claims priority to, U.S. patent application Ser. No. 12/464,597, filed on May 12, 2009, granted on Mar. 20, 2012 as U.S. Pat. No. 8,138,412, the full disclosure of which is incorporated herein by reference.

BACKGROUND

Photovoltaic cells, commonly referred to as "solar cells", are receiving increased attention as the pursuit of renewable energy solutions advances. Incident light causes the photovoltaic (PV) cell to produce an electrical potential that can be combined with that of other PV cells and used for charging storage batteries, energizing electronic devices, etc.

Typically, numerous PV cells are electrically coupled so as to define an array capable of providing usable voltage and current output. It is desirable to mass produce the supporting substrates and interconnecting circuitry for arrays of PV cells such that the overall cost per watt of generated power can be reduced relative to known techniques.

Accordingly, the embodiments described hereinafter were developed in the interest of addressing the foregoing issues.

BRIEF DESCRIPTION OF THE DRAWINGS

The present embodiments will now be described, by way of example, with reference to the accompanying drawings, in which.

DETAILED DESCRIPTION

Introduction

Means and methods for providing flexible and scalable photovoltaic arrays are provided by the present teachings. A flexible substrate layer having metallic bus-lines and connecting electrically-conductive stitches is formed. A trace layer having electrical traces and thermal vias is also formed. The substrate layer and the trace layer are bonded together by way of respective thermal pathways and electrically interconnected. The resulting layer-wise assembly is configured to support and electrically interconnect an array of photovoltaic cells and to channel away heat during operation. The assembly is scalable in either or both width and length (i.e., X and Y) dimensions as desired such that an array having overall electrical generating characteristics is provided.

In one embodiment, a method includes forming a plurality of metal strips on a flexible material so as to define a first layer. The method also includes forming a plurality of electrical traces and a plurality of thermal vias on a metal foil so as to define a second layer. Additionally, the method includes bonding the first layer to the second layer by way of bonding the plurality of thermal vias to respective ones of the metal strips using a thermally conductive electrically non-conductive adhesive. The method further includes removing the metal foil, and electrically bonding at least some of the plurality of electrical traces to respective ones of the metal strips.

In another embodiment, an apparatus includes a flexible thermally conductive electrically non-conductive material defining a substrate. The apparatus also includes a plurality of metallic strips supported by the substrate. Additionally, the apparatus includes a plurality of electrical traces disposed over the strips. At least some of the electrical traces are electrically bonded to respective ones of the metallic strips so as to define electrical bus-lines. The apparatus further includes a plurality of thermal vias disposed over and bonded to respective ones of the metallic strips so as to define heat spreader bus-lines.

In yet another embodiment, an array of photovoltaic cells includes a substrate of flexible and thermally conductive and electrically non conductive material. The array also includes a plurality of electrically conductive bus-lines disposed in parallel arrangement on the substrate. Additionally, a plurality of thermally-conductive heat spreader bus-lines are disposed in parallel arrangement on the substrate. The array also includes a plurality of thermal vias bonded to respective ones of the heat spreader bus-lines. The array further includes a plurality of electrical traces electrically coupled to respective ones of the electrically conductive bus-fines. At least some of the electrical traces are disposed over and are electrically isolated from respective ones of the electrically conductive bus-lines.

First Illustrative Embodiment

Figure 1:
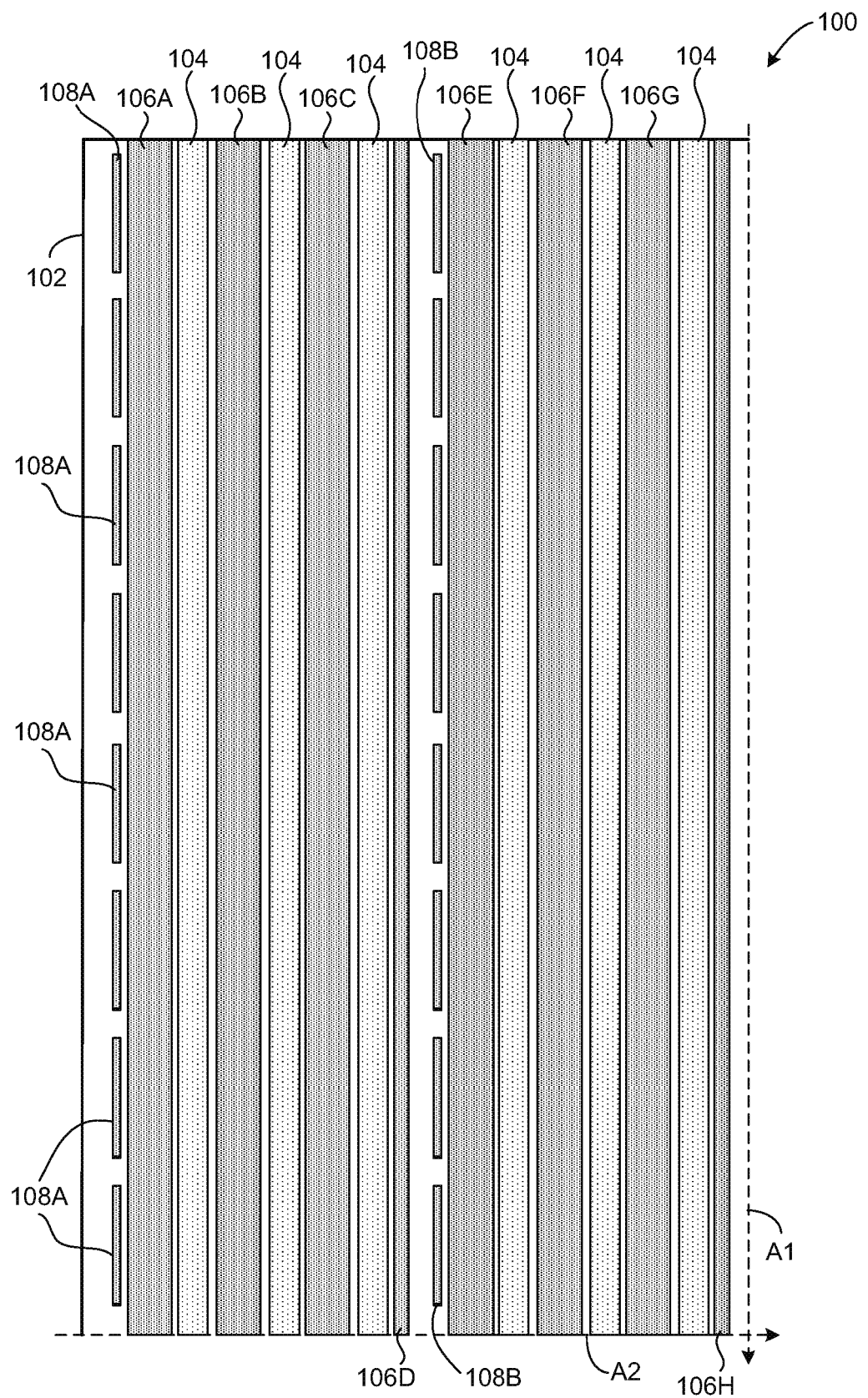
FIG. 1 depicts a plan view of a flexible substrate layer according to an embodiment.

FIG. 1 depicts a plan view of a substrate 100 according to one embodiment. The substrate 100 is illustrative and non-limiting with respect to the present teachings. Thus, other substrates can also be defined, produced and used according to the present teachings.

The substrate 100 includes a sheet material 102. The sheet material 102 is flexible in nature, is thermally conductive, and is electrically non-conductive. That is, the sheet material 102 is a generally good conductor of heat, while also being a good electrical insulator. Additionally, the sheet material 102 can be transparent, translucent or opaque. Non-limiting examples of the sheet material 102 include Arcticon composites as available from Ovation Polymers, Inc., Medina, Ohio, USA. The sheet material 102 can be of any suitable dimensions. In one embodiment, the sheet material 102 is provided in roll form, having a width of about one-hundred twenty-five millimeters and a total roll length of about one-hundred meters with a thickness of two-hundred microns. Other suitable dimensions can also be used. As implied by the arrows A1 and A2 of FIG. 1, the sheet material 102 can continue in either or both of these directions as desired.

The substrate 100 includes a plurality of metallic strips, or metalized areas, 104. The metallic (metal) strips 104 define heat spreader bus-lines that are supported on the flexible material 102. Illustrative and non-limiting dimensions for the metallic strips 104 are four millimeters wide by forty microns thick. Length (i.e., along direction A1) of the metal strips 104 can be any suitable value depending on the finished size of the substrate 100. The metal strips 104 can be formed (or grown) from any suitable metal or metallic material such as, for non-limiting example, copper, aluminum, nickel, etc. Other metals and/or materials can also be used. Further description regarding the formation of the metal strips 104 is provided hereinafter.

The substrate 100 further includes metallic strips, or metalized areas, 106A, 106B, 106C, 106D, 106E, 106F, 106G and 106H. The metallic (metal) strips 106A-106H define electrical bus-lines that are supported on the flexible material 102. In particular, the metal strips 106A-106H are further designated and non-limiting dimensions are provided according to Table 1 below:

TABLE 1

Bus-Lines

| Element | Designation | Width × Thickness |
|---------|-------------|-------------------|
| 106A | Common Cathode Bus | 7 mm × 40 microns |
| 106B | Mid-Energy Tap Bus | 7 mm × 40 microns |
| 106C | Mid-Energy Anode Bus | 7 mm × 40 microns |
| 106D | Low-Energy Anode Bus | 2 mm × 40 microns |
| 106E | Common Cathode Bus | 7 mm × 40 microns |
| 106F | Mid-Energy Tap Bus | 7 mm × 40 microns |
| 106G | Mid-Energy Anode Bus | 7 mm × 40 microns |
| 106H | Low-Energy Anode Bus | 2 mm × 40 microns |

The metal strips (i.e., bus-lines) 106A-106H can be formed (or grown) from any suitable metal or metallic material such as, for non-limiting example, copper, aluminum, nickel, etc. Other metals and/or materials can also be used. Further description regarding the formation of the metal strips 106A-106H is provided hereinafter.

The substrate 100 further includes a pair of discontinuous (dashed or stitched) rows of metalized (metal or metallic) areas 108A and 108B. The metal areas 108A-108B define respective low-energy stitch bus-lines. Illustrative and non-limiting dimensions for each of the metallic areas 108A and 108B are one millimeter wide by forty microns thick. Length (i.e., along direction A1) of each row of the metal areas 108A and 108B can be any suitable value depending on finished size of the substrate 100. The metal areas 108A and 108B can be formed (or grown) from any suitable metal or metallic material such as, for non-limiting example, copper, aluminum, nickel, etc. Other metals and/or materials can also be used. Further description regarding the formation of the metallic areas 108A-108B is provided hereinafter.

The substrate 100 is configured to provide a Flexible, support sheet to which a plurality of photovoltaic cells is bonded. In turn, the photovoltaic cells are electrically interconnected to respective ones of each other and the bus-lines 106A-106H and metal areas 108A-108B. An array of photovoltaic cells, having particular voltage and/or electrical current generating characteristics, is thus defined. Furthermore, the heat spreader bus-lines 104 provide means for channeling heat away from the photovoltaic cells to an underlying heat sink or other heat transfer means. Further description regarding the formation of the substrate 100 is provided hereinafter.

Figure 2:
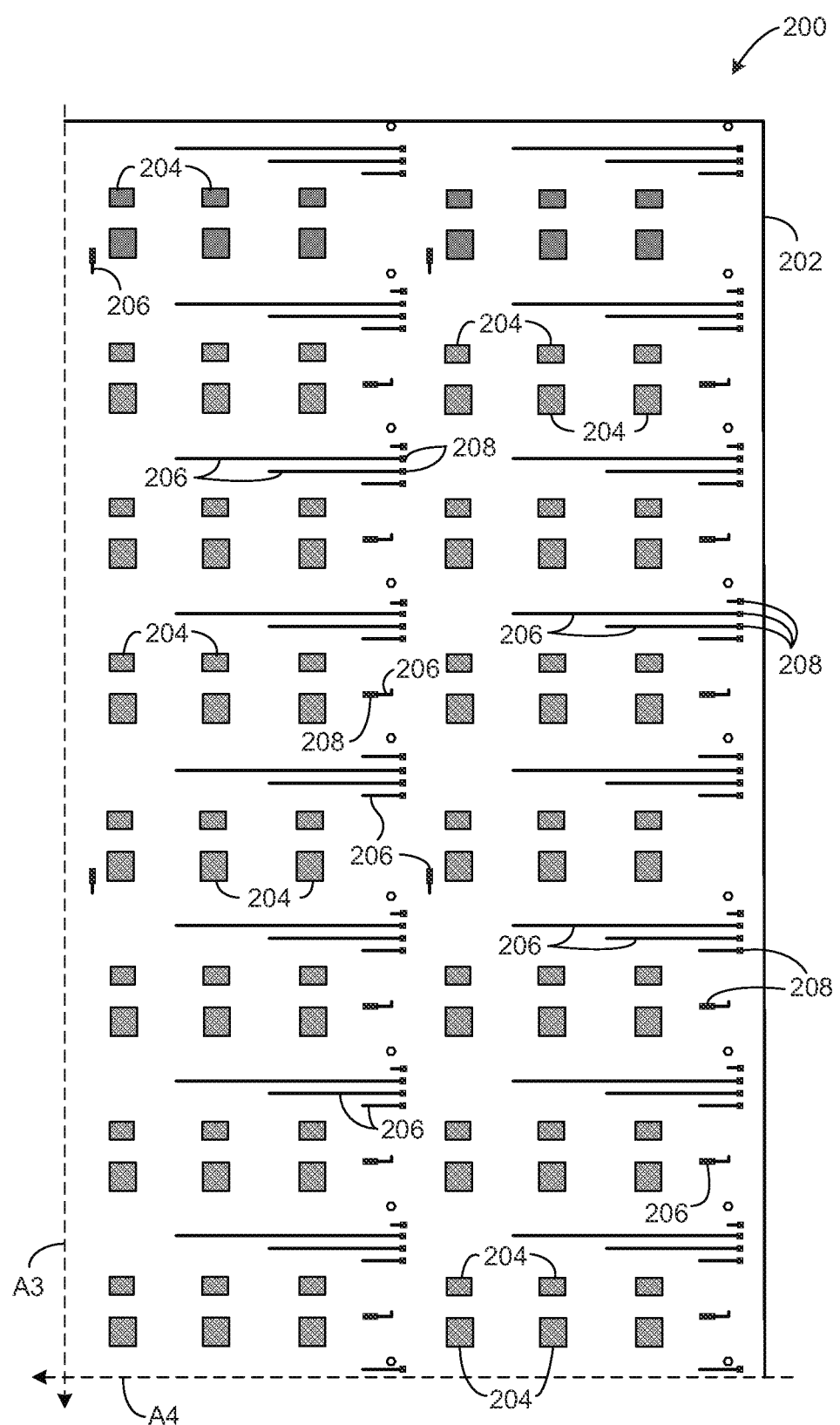
FIG. 2 depicts a plan view of a trace layer according to an embodiment.

FIG. 2 depicts a plan view of electrical traces and thermal vies, collectively referred to as a pattern 200, according to one embodiment. The pattern 200 is illustrative and non-limiting with respect to the present teachings. Thus, other patterns can also be defined, produced and used according to the present teachings.

The pattern 200 includes a supportive metal foil 202. The metal foil 202 is typically—but not necessarily—flexible in nature. In one embodiment, the metal foil 102 is defined by type 316L stainless steel being of any suitable dimensions. The metal foil 202 can be of any suitable dimensions. In one embodiment, the metal foil 202 is provided in roll form, having a width of about one-hundred twenty-five millimeters and a total roll length of about one-hundred meters, with a thickness of fifty microns. Other suitable dimensions can also be used. As implied by the arrows A3 and A4 of FIG. 2, the metal foil 202 can continue in either or both of these directions as desired.

The pattern 200 also includes a plurality of thermal vias 204. Each of the thermal vies is formed of metal or metallic material such as, for non-limiting example, copper, aluminum, nickel, etc. Each thermal via 204 is configured to transport heat away from photovoltaic cells (See FIG. 4) to respective ones of the heat spreader bus-lines 104. As such, each thermal via 204 is dimensionally defined according to the width of the heat spreader bus-line 104 to which it is bonded, and the width of the photovoltaic cell that is bonded to that thermal via 204. The thermal vies 204 are of uniform thickness. In one embodiment, the thermal vies are forty microns in thickness. Other thickness dimensions can also be used. The thermal vies 204 are supported on the metal foil 202 until they are bonded to their respective heat spreader bus-lines 104, the metal foil 202 being removed thereafter.

The pattern 200 also includes a plurality of electrical traces 206. The electrical traces 206 are formed of a conductive material such as, for non-limiting example, copper, aluminum, nickel, etc. The electrical traces 206 can also be formed from another suitable electrically conductive material. In one embodiment, the thermal vias 204 and the electrical traces 206 are formed from the same material. Each electrical trace 206 is configured to be electrically bonded (i.e., coupled) to a respective one of the bus-lines 106A-106H or metal areas 108A-108B. Illustrative and non-limiting dimensions for the traces 206 are zero-point-five millimeters (i.e., 0.5 mm) in width, forty microns in thickness, and of varying length according to the respective electrical coupling to be established.

The electrical traces 206 include or define an electrical contact pad 208. Each contact pad 208 is configured to be electrically coupled to one or more other entities (described hereinafter) by way of wire-bonding. In the alternative, each contact pad 208 is configured to wrapped or bent into contact with another node or entity and electrically bonded thereto.

The pattern 200, being generally supported during formation on the metal foil 202, is eventually joined to the substrate 100 so as to define an assembly. The assembly process is generally performed as follows: the substrate 100 and the pattern 200 are aligned in a facing orientation such that the sheet material 102 and the metal foil 202 face away from each other. The thermal vias 204 are bonded to respective ones of the heat spreader bus-lines 104 using a thermally conductive, electrically non-conductive adhesive.

Once the adhesive is cured, the metal foil 202 is removed. Next, the electrical traces 206 are electrically bonded to respective ones of the bus-lines 106A-106H or metal areas 108A-108B. In one embodiment, laser bonding is used to perform the electrical coupling. Further steps are also performed as described in detail hereinafter. None the less, the pattern 200 of thermal vias 204 and electrical traces 206 is transferred onto the substrate 100.

Figure 3:
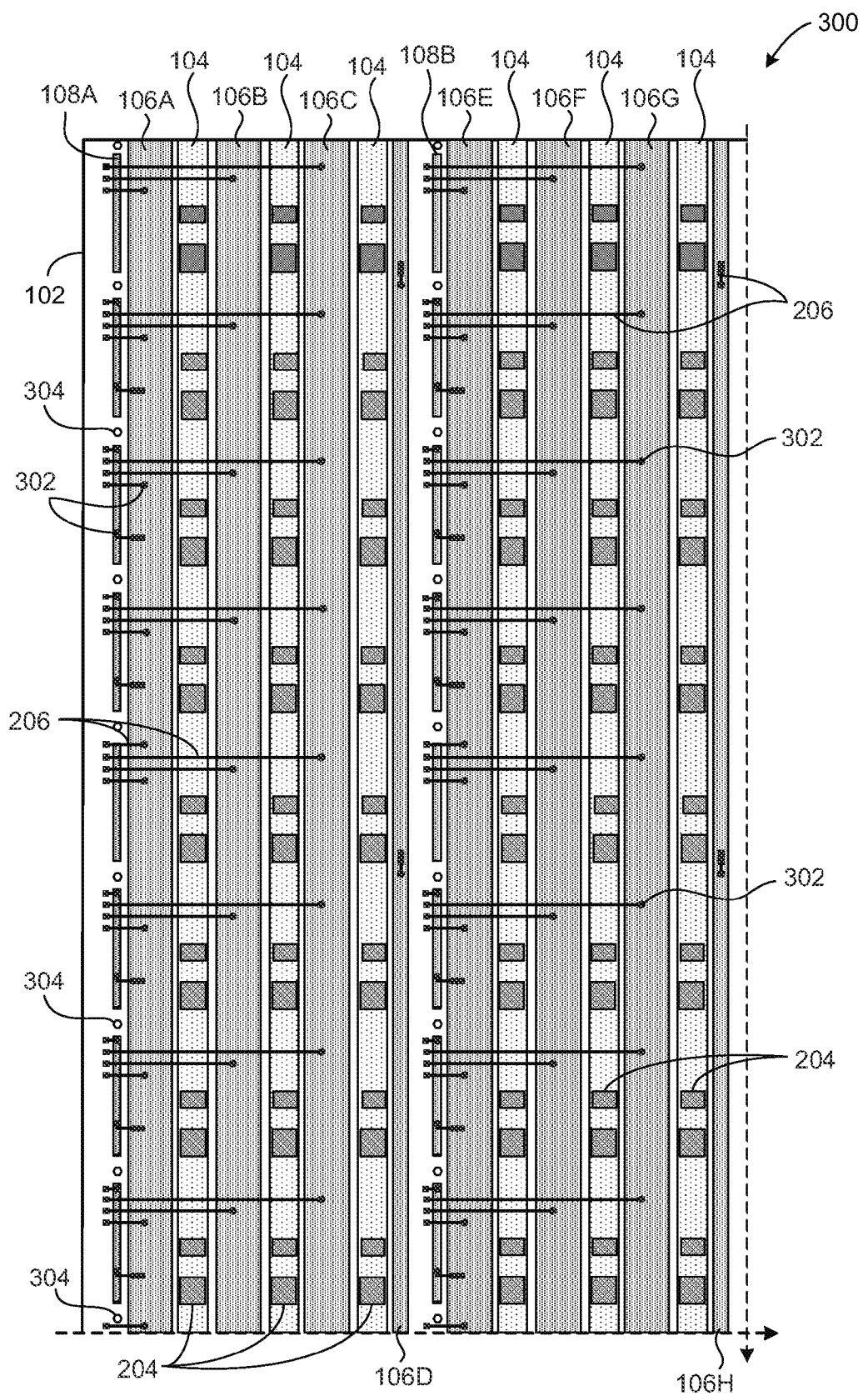
FIG. 3 depicts plan view of an assembly of layers according to an embodiment.

FIG. 3 depicts a an view of an assembly 300 according to one embodiment. The assembly 300 is illustrative and non-limiting with respect to the present teachings. Thus, other assemblies can also be defined, produced and used according to the present teachings.

The assembly 300 includes the flexible material 102, which supports the heat spreader bus-lines 104, the bus-lines 106A-106H and the metal areas 108A-108B. The assembly also includes the thermal vias 204, which have been bonded to respective heat spreader bus-lines 104 by way of thermally conductive electrically non-conductive adhesive.

The assembly also includes the electrical traces 206. The electrical traces 206 have been electrically bonded to respective ones of the bus-lines 106A-106H and the metal areas 108A-108B. Such bonds 302 can be formed, for non-limiting example, by laser welding. Other suitable methods and/or means for electrically coupling (i.e., bonding) 302 the electrical traces 206 to respective ones of the bus-lines 106A-106H and the metal areas 108A-108B can also be used. It is noted that each electrical trace 206 is electrically bonded to only one of the bus-lines 106A-106H or metal areas 108A-108B and is electrically isolated from all others. In this way, numerous of the electrical traces 206 are disposed over and are isolated from one or more of the bus-lines 106A-106H and/or metal areas 108A-108B. Index marks (or holes) 304 are formed on the flexible material 102 by way of, for non-limiting example, laser scribing or ablation. Other means for forming the index marks 304 can also be used. Such index marks 304 are used for aligning the installation concentrating lenses, photovoltaic cells or other elements later in assembling a complete photovoltaic array using the assembly 300.

The assembly 300 includes all of the elements of the substrate 100 and the pattern 200, less the metal foil 202 that has been removed. The assembly 300 can be readily mass produced in a roll-to-roll, essentially continuous process such that economies of scale can be leveraged. The assembly 300 is configured to have numerous photovoltaic cells bonded thereto and to provide for electrically coupling those photovoltaic cells such that an array is defined.

Figure 4:
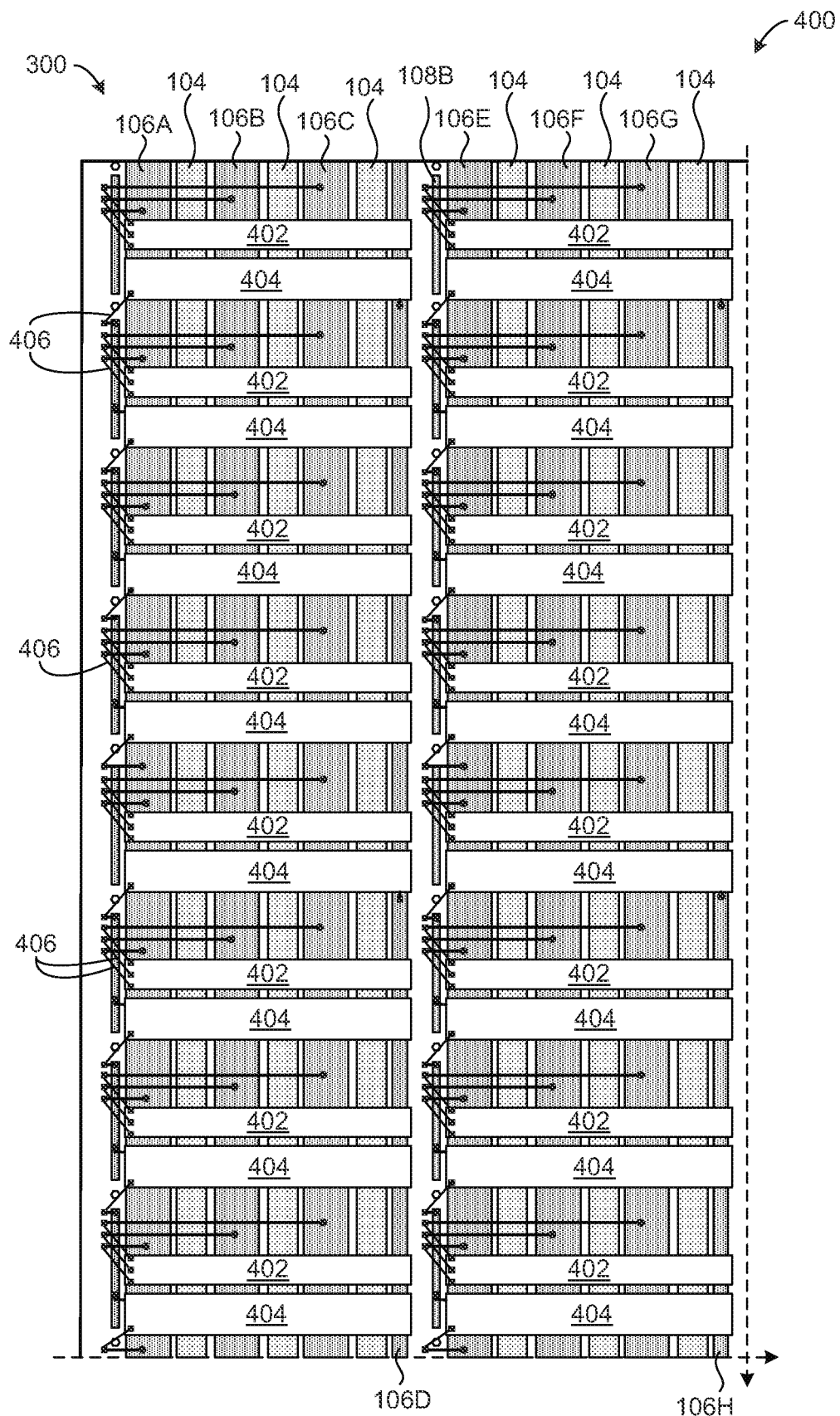
FIG. 4 depicts plan view of an assembly having photovoltaic cells according to an embodiment.

FIG. 4 depicts a plan view of a photovoltaic array (array) 400 according to one embodiment. The array 400 is illustrative and non-limiting with respect to the present teachings. Thus, other arrays can also be defined, produced and used according to the present teachings. The array 400 includes the assembly 300 as described above in regard to FIG. 3.

The array 400 also includes a plurality of mid-energy photovoltaic (PV) cells 402. The PV cells 402 are configured to exhibit (i.e., generate or produce) an electrical potential in response to ambient electromagnetic radiation (i.e., solar energy or light) above a predetermined band gap. For non-limiting example, the PV cells 402 are responsive to solar energy above a band gap of one-point-eight electron-volts (i.e., 1.8 eV). Other PV cells corresponding to other band gaps can also be used. Each of the PV cells 402 is bonded to and supported by way of a respective number of thermal vias 204 (See FIG. 3). The PV cells 402 are bonded to their respective thermal vias 204 by way of thermally ally conductive electrically non-conductive adhesive.

The array 400 also includes a plurality of low-energy photovoltaic (PV) cells 404. The PV cells 404 are configured to exhibit (i.e., generate or produce) an electrical potential in response to ambient electromagnetic radiation (i.e., solar energy or light) in another predetermined spectral band. For non-limiting example, the PV cells 404 are responsive to solar energy above a band gap of one-point-one-two electron-volts (i.e., 1.12 eV). Other PV cells corresponding to other band gaps can also be used. Each of the PV cells 404 is bonded to and supported by way of a respective number of thermal vies 204 (See FIG. 3). The PV cells 404 are bonded to their respective thermal vias 204 by way of thermally conductive electrically non-conductive adhesive.

The mid-energy PV cells 402 and the low-energy PV cells 404 are electrically coupled to respective bus-lines 106A-106H or metal areas 108A-108B. In some cases, wire bonds 406 are used as needed to complete the electrical coupling to respective ones of the electrical traces 206 (See FIG. 3). In other cases, the contact pads 208 (See FIG. 2) of respective electrical traces 206 are electrically bonded to either the bottom side of a respective PV cell 402 or 404. In another embodiment, the contact pads 208 are formed so as to be wrapped and/or routed as need and bonded to the top side of a respective PV cell 402 or 404. Such direct electrical connection of the contact pads 208 to respective photovoltaic cells or other electrical nodes is referred to herein as "tab-wrapping". Electrical bonding can be performed by way of electrically conductive adhesive. Other suitable electrical bonding (coupling) techniques can also be used.

The electrical bonding is such that the photovoltaic cells 402 and 404 define an array. The electrical voltage and current produced by the array is accessible by suitable connection between and to the bus-lines 106A-106H. Optical concentration elements or lenses (not shown) can be installed over the photovoltaic cells 402 and 404, making use of the index marks 304. Other finishing steps can also be performed such that the assembly 300 is used to support and define a photovoltaic array.

Second Illustrative Embodiment

Figure 5:
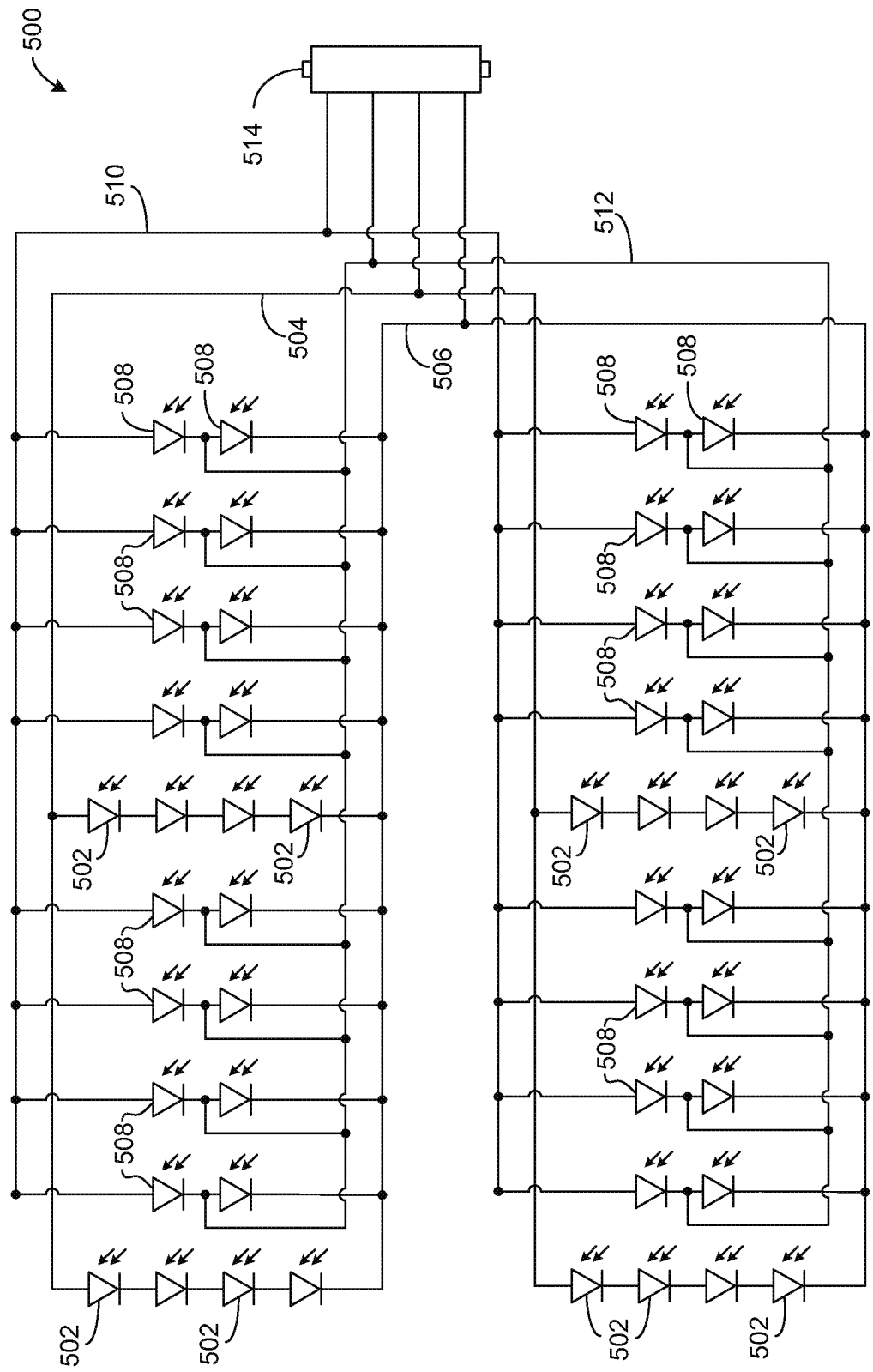
FIG. 5 depicts a schematic view of a photovoltaic array according to another embodiment.

FIG. 5 is a schematic view depicting a photovoltaic array 500 according to another embodiment. The photovoltaic array 500 is illustrative and non-limiting in nature. Other arrays according to the present teachings can also be configured, manufactured and used.

The array 500 includes a plurality of low-energy photovoltaic cells 502. The photovoltaic cells 502 are electrically connected in series circuit arrangement of four cells 502 each. Within each series of four, an anode (i.e., positive polarity) of an end photovoltaic cell 502 is connected to a node 504, while the cathode (i.e., negative polarity) of the opposite end photovoltaic cell 502 is connected to a node 506. In one embodiment, each of the low-energy photovoltaic cells 502 produces about zero-point-five-five volts (i.e., 0.55V) under normal operating conditions. Other photovoltaic cells exhibiting other respective operating voltages can also be used.

The array 500 also includes a plurality of mid-energy photovoltaic cells 508. The photovoltaic cells 508 are electrically connected in series circuit arrangement of two cells 508 each. Within each series of two, an anode (i.e., positive polarity) of an end photovoltaic cell 508 is connected to a node 510, while the cathode (i.e., negative polarity) of the opposite end photovoltaic cell 508 is connected to the node 506. Additionally, a center tap location between each pair of photovoltaic cells 508 is connected to a node 512. In one embodiment, each of the mid-energy photovoltaic cells 508 produces about one-point-one-two-five volts (i.e., 1.125V) under normal operating conditions. Other photovoltaic cells exhibiting other respective operating voltages can also be used.

The respective nodes 504, 506, 510 and 512 are electrically connected to a connector 514. Thus, under normal use, the electrical potential provided by the array 500 can be coupled to other circuitry or devices (not shown) such as, for non-limiting example, power conditioning circuitry, one or more rechargeable storage batteries, a communications device, a portable computing device, a global positioning system (GPS) receiver, etc.

The array 500 is illustrative of any number of photovoltaic arrays that can be configured and used in accordance with the present teachings. Thus, the respective photovoltaic cells 502 and 508 can be bonded to respective thermal vies 204 by way of thermally conductive electrically non-conductive adhesive. Series-of-four arrangements of the photovoltaic cells 502 and series-of-two arrangements of the photovoltaic cells 508 can be established by electrically coupling the respective photovoltaic cells 502 and 508 using wire bonds 406 and/or tab-wrapping. In turn, the respective series circuits that are established are electrically coupled to respective ones of the bus-lines 106A-106H and/or the metal areas 108A-108B. The entire illustrative array 500 can be supported by the underlying flexible material 102. The array 500 and numerous other arrays (not shown) of respective configuration can be effectively mass produced in accordance with the present teachings.

First Illustrative Method

Figure 6:
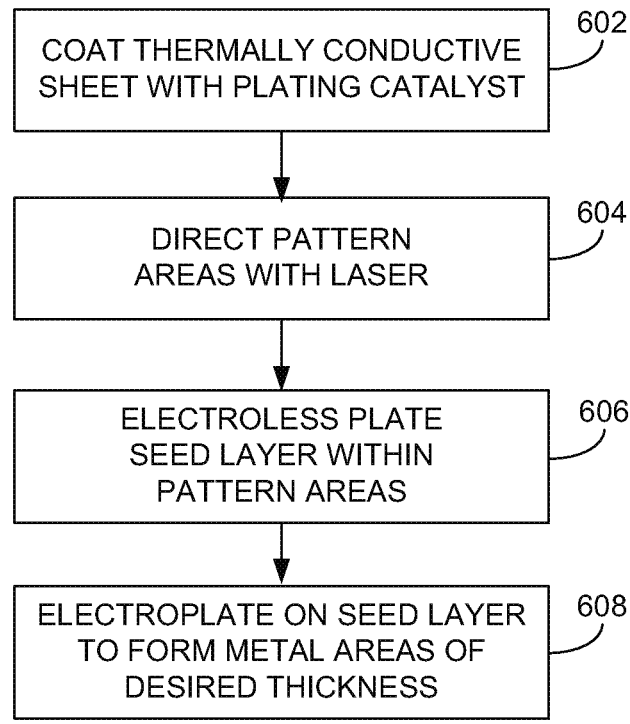
FIG. 6 depicts a flow diagram of a method according to an embodiment.

FIG. 6 is a flow diagram depicting a method according to one embodiment of the invention. The method of FIG. 6 includes particular operations and order of execution. However, other methods including other operations, omitting one or more of the depicted operations, and/or proceeding in other orders of execution can also be used according to the present teachings. Thus, the method of FIG. 6 is illustrative and non-limiting in nature.

At 602, a flexible, thermally conductive and electrically non-conductive sheet material is coated on one side with a plating catalyst. For non-limiting example, the sheet material can be Arcticon composites as available from Ovation Polymers, Inc., and the plating catalyst can be Cataposit 44 Catalyst as available from Rohm & Haas Co., Philadelphia, Pa., USA. In one embodiment, a roll-to-roll arrangement is used and the sheet material is coated with the plating catalyst in portions in a batch-like process. In another embodiment, one entire side of the sheet material is coated as a single step. Other arrangements can also be used. In one embodiment, the plating catalyst is applied as a layer less than one-hundred nanometers in thickness. Other thicknesses can also be used.

At 604, at laser is used to pattern the plating catalyst. In particular, the laser is used to ablate those areas where catalyst is not needed such that the remaining (i.e., undisturbed) plating catalyst defines areas for forming bus-lines (e.g., 104 and 106A-106H, etc.) and/or other metallic areas (e.g., 108A-108B).

At 606, electroless plating is used to form a seed layer of metal within those areas of plating catalyst left intact after patterning at 604 above. For non-limiting example, such a seed layer can be copper, aluminum, nickel, a metal alloy, etc. In one embodiment, the seed layer is one atom/molecule thick. Other thicknesses can also be used.

At 608, electroplating is used to form metal of desired thickness within the pattern areas bearing a seed layer. Such metal is the same as, or compatible with, the metal or metal alloy used to form the seed layer. Thus, for non-limiting example, the patterned areas can be filled with copper, aluminum, nickel, a metal alloy, etc., of desired thickness. In one embodiment, the metal areas are formed to be forty microns thick. Other thicknesses can also be used. In this way, heat spreader bus-lines (e.g., 104), electrical bus-lines (e.g., 106A-106H) and metal areas or "stitches" (e.g., 108A-108B) are formed on the flexible material. The flexible material, having the heat spreader bus-lines and electrical bus-lines and metal stitches formed thereon is referred to as a "substrate layer" or "substrate" for purposes herein.

Second Illustrative Method

Figure 7:
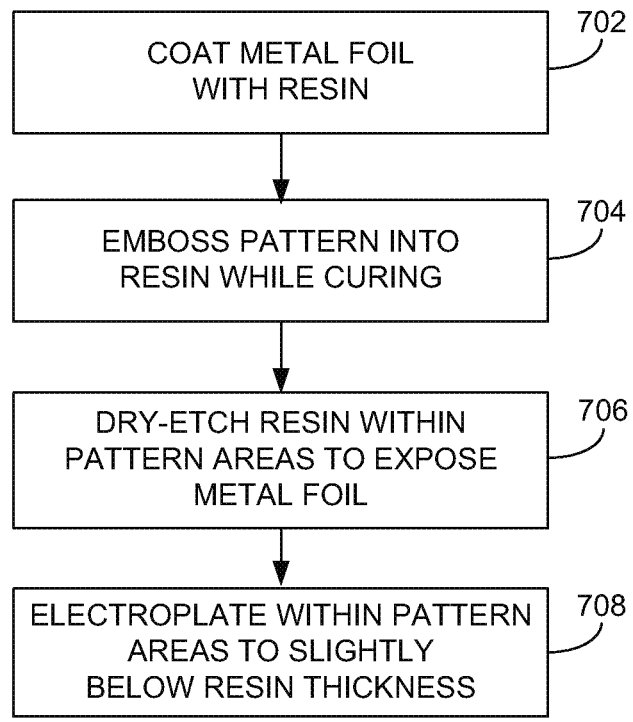
FIG. 7 depicts a flow diagram of a method according to another embodiment.

FIG. 7 is a flow diagram depicting a method according to one embodiment of the invention. The method of FIG. 7 includes particular operations and order of execution. However, other methods including other operations, omitting one or more of the depicted operations, and/or proceeding in other orders of execution can also be used according to the present teachings. Thus, the method of FIG. 7 is illustrative and non-limiting in nature.

At 702, a metal foil is coated on one side with a resin material. For non-limiting example, the metal foil can be cold-rolled 316L stainless steel foil as available from Outokumpu, Espoo, Finland. In turn, the resin can be Norland Optical Adhesive NOA83H as available from Norland Products, Inc., Cranbury, N.J., USA. In one embodiment, a roll-to-roll arrangement is used and the metal foil is coated with the resin in a batch-like process. In another embodiment, one entire side of the metal foil is coated as a single step. Other arrangements can also be used. In one embodiment, the resin is applied as a layer fifty microns in thickness. Other thicknesses can also be used.

At 704, a pattern is embossed into the resin while the resin is being cured. In one embodiment, ultraviolet (UV) light is used to cure the resin. Other curing methods can also be used. The pattern embossed into the resin defines numerous areas for forming electrical traces (e.g., 206) and thermal vias (e.g., 204).

At 706, a dry-etch process is used to expose the metal foil within the areas defined by the embossing at 704 above. For non-limiting example, an oxygen ($O_2$) dry etch can be used. Thus, resin is removed from the areas defined at 704 above. It is important to note that resin outside of the embossed areas is left intact on the metal foil during and after the dry-etch process.

At 708, electroplating is used to form metal of desired thickness within the pattern areas where the metal foil is exposed. For non-limiting example, the patterned areas can be filled with copper, aluminum, nickel, a metal alloy, etc., of desired thickness. In one embodiment, the metal areas are formed such that the resulting electrical traces are forty microns thick, while the thermal vias are forty microns thick. Other respective thicknesses can also be used. The metal areas are formed to be of slightly less thickness than the surrounding resin. The metal foil (e.g., 202) now supports respective electrical traces (e.g., 206) and thermal vies (e.g., 204). The metal foil, having the electrical traces and thermal vies and resin supported thereon is referred to as a "trace layer" or "top layer" for purposes herein.

Third Illustrative Method

Figure 8A:
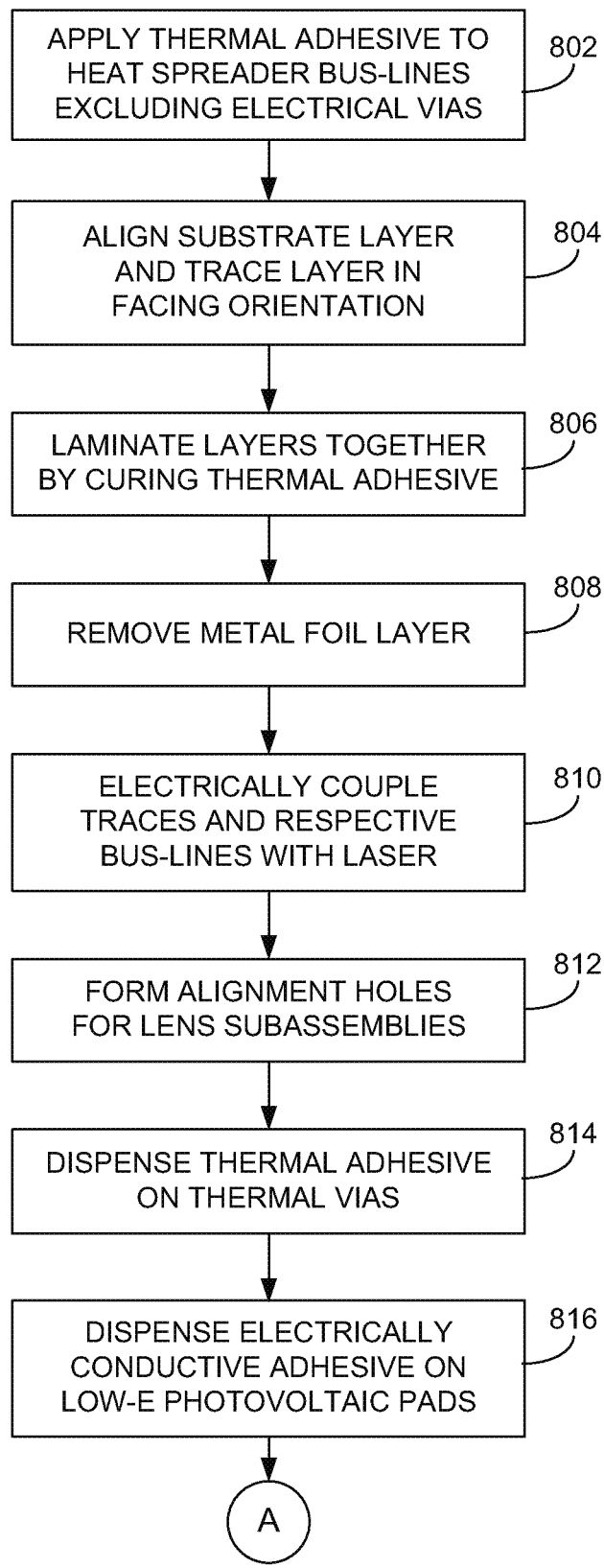
FIG. 8A depicts a flow diagram of first portion of a method according to yet another embodiment.
Figure 8B:
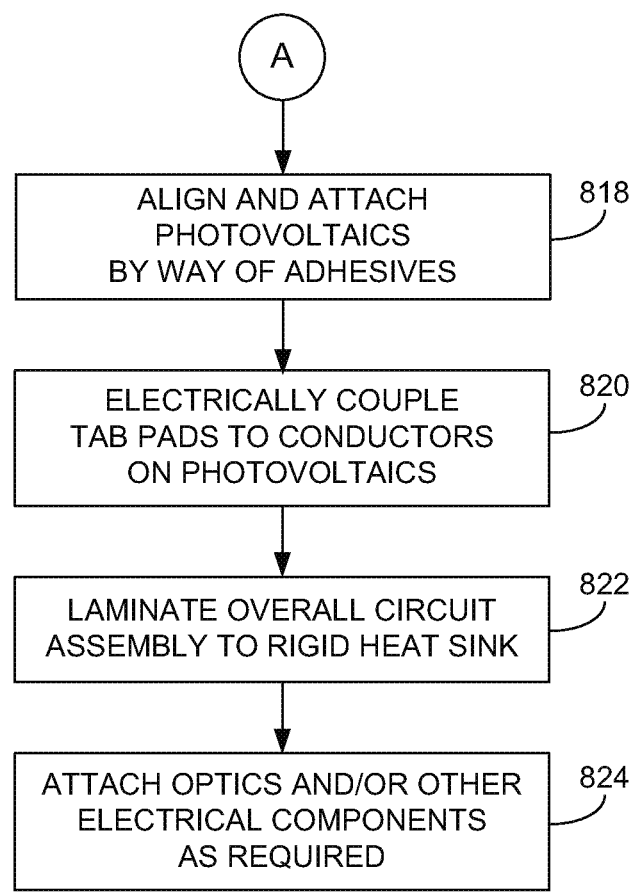
FIG. 8B depicts a flow diagram of a second portion of the method of FIG. 8A.

FIGS. 8A and 8B collectively depict a flow diagram of a method according to one embodiment of the invention. The method of FIGS. 8A-8B includes particular operations and order of execution. However, other methods including other operations, omitting one or more of the depicted operations, and/or proceeding in other orders of execution can also be used according to the present teachings. Thus, the method of FIGS. 8A-8B is illustrative and non-limiting in nature.

At 802, a thermally conductive electrically non-conductive adhesive is applied to the surface of the substrate layer, including the heat spreader bus-lines (e.g., 104) formed on a substrate layer, but excluding the areas of subsequent electrical connection (vies). For example, such a substrate layer can be formed according to the method of FIG. 6. In one embodiment, the thermally conductive electrically non-conductive adhesive can be EP30AN as available from Master Bond, Inc., Hackensack, N.J., USA. Other suitable adhesives can also be used.

At 804, the substrate layer used at 802 above is aligned in facing orientation with a corresponding trace layer. For example, such a trace layer can be formed according to the method of FIG. 7. Orientation is such that the flexible material of the substrate layer and the metal foil of the trace layer face are disposed away from each other.

At 806, the substrate layer and the trace layer are brought together with the thermal vies (e.g., 204) of the trace layer making contact with the adhesive born by the heat spreader bus-lines (e.g., 104) of the substrate layer. The thermal adhesive is cured so as to bond the thermal vias to respective heat spreader bus-lines. It is noted that at this point, the electrical traces (e.g., 206) of the traces layer are not in contact with any of the bus-lines (e.g., 106A-106H) or metal areas (e.g., 108A-108B). The electrical traces (e.g., 206) of the trace layer are supported in their respective places on the trace layer by way of resin material.

At 808, the metal foil of the trace layer is removed. The resin remains behind and thus provides ongoing support for the electrical traces.

At 810, electrical traces (e.g., 206) are bonded to respective ones of the electrical bus lines (e.g., 106A-106H) and/or metal stitches (e.g., 108A-1083) by way of laser welding. Such bonds (e.g., 302) are formed such that the respective electrical traces make electrical contact with only those bus-lines and/or metal areas as needed or desired.

At 812, index holes or marks (e.g., 304) are formed in the flexible substrate material (e.g., 102) using a laser. Such index marks can be used for alignment and/or attachment of photovoltaic cells, optical elements (lenses), or other assembly operations.

At 814, a thermally conductive electrically non-conductive adhesive is applied to the thermal vias (e.g., 204) previously bonded to the heat spreader bus-lines (e.g., 104). Thus, the adhesive presently applied is born on outward facing surfaces of the thermal vies. In one embodiment, the thermally conductive electrically non-conductive adhesive can be EP30AN as available from Master Bond, Inc. Other suitable adhesives can also be used.

At 816, an electrically conductive adhesive is applied to respective electrical contact pads (e.g., 208) configured to be electrically bonded an anode or cathode of a respective low-energy photovoltaic cell (e.g., 404). In one embodiment, the thermally conductive electrically non-conductive adhesive can be EMS 405-57-7 as available from Engineered Materials Systems, Inc., Delaware, Ohio, USA. Other suitable adhesives can also be used. Attention is now directed to FIG. 8B.

At 818, respective photovoltaic cells (e.g., 402 and 404) are attached to respective locations on the thermal vies (e.g., 204) and contact pads (e.g., 208) by way of the adhesive born on each. The photovoltaic cells are thus fixedly bonded to the underlying flexible material (e.g., 102).

At 820, wire bonds (e.g., 406) are used to electrically connect the photovoltaic cells to respective ones of the electrical traces (e.g., 206) such that a photovoltaic array is defined. For non-limiting example, see the array 500 depicted in schematic form in FIG. 5. In another embodiment, some or all of the electrical interconnections can be formed by tab-wrapping, wherein respective contact pads (e.g., 208) are electrically bonded to anode or cathode nodes of respective photovoltaic cells. Other suitable connections can also be used.

At 822, the photovoltaic array defined at 820 above is thermally bonded to a supporting structure such as, for non-limiting example, an aluminum heat sink. Thus, the supporting structure (e.g., heat sink) is bonded to the previously unused side of the substrate flexible material (e.g., 102). Bonding to an underlying heat sink or other structure typically gives the overall photovoltaic array rigidity and structural strength.

At 824, concentrating lenses, electrical connectors, and/or other elements are connected to the photovoltaic array assembled at 800 through 822 above. The photovoltaic array, using substrate layer and trace layer construction techniques according to the present teachings, is now complete.

In general, the foregoing description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

What is claimed is:

1. A method, comprising:
   forming a plurality of metal strips on a flexible material so as to define a first layer;
   forming a plurality of electrical traces and a plurality of thermal vias on a metal foil so as to define a second layer;
   bonding the first layer to the second layer by way of bonding the plurality of thermal vias to respective ones of the metal strips using a thermally conductive electrically non-conductive adhesive;
   removing the metal foil; and
   electrically bonding at least some of the plurality of electrical traces to respective ones of the metal strips.

2. The method according to claim 1, the flexible material further defined by a flexible thermally-conductive electrically non-conductive material.

3. The method according to claim 1, at least some of the metal strips defining heat spreader bus-lines, the thermal vias being bonded to respective ones of the heat spreader bus-lines using the thermally conductive electrically non-conductive adhesive.

4. The method according to claim 1, the thermal vias and the electrical traces being formed from a same metal.

5. The method according to claim 1 further comprising:
   applying a plating catalyst to the flexible material;
   patterning the plating catalyst so as to define plural areas;
   electroless plating so as to form a seed layer within each of the plural areas; and
   electroplating over the seed layers so as to form the plurality of metal strips on the flexible material.

6. The method according to claim 1 further comprising:
   applying a resin to the metal foil;
   embossing and curing the resin so as to define plural areas;
   etching the resin so as to expose the metal foil within each of the plural areas; and
   electroplating within the plural areas to as to form the plurality of electrical aces and the plurality of thermal vias.

7. The method according to claim 1 further comprising bonding a plurality of photovoltaic elements to respective ones of the thermal vies using thermally conductive adhesive.

8. The method according to claim 7 further comprising:
   electrically coupling the photovoltaic elements to respective ones of the electrical traces so as to define a photovoltaic array.

9. The method according to claim 1 further comprising bonding the flexible material to a heat sink.

* * * * *

UNITED STATES PATENT AND TRADEMARK OFFICE
CERTIFICATE OF CORRECTION

PATENT NO. : 8,701,280 B2  
APPLICATION NO. : 13/367915  
DATED : April 22, 2014  
INVENTOR(S) : Karl S Weibezahn Page 1 of 1

It is certified that error appears in the above-identified patent and that said Letters Patent is hereby corrected as shown below:

In the Claims

In column 10, line 58, in Claim 6, delete "to as" and insert -- so as --, therefor.

In column 10, line 59, in Claim 6, delete "aces" and insert -- traces --, therefor.

In column 10, line 63, in Claim 7, delete "vies" and insert -- vias --, therefor.

Signed and Sealed this  
Thirtieth Day of September, 2014

Michelle K. Lee  
*Deputy Director of the United States Patent and Trademark Office*